United States Patent
Choi

(10) Patent No.: US 7,696,795 B2
(45) Date of Patent: Apr. 13, 2010

(54) POWER-ON RESET CIRCUIT

(75) Inventor: Won Beom Choi, Incheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 119 days.

(21) Appl. No.: 11/751,589

(22) Filed: May 21, 2007

(65) Prior Publication Data

US 2008/0100351 A1    May 1, 2008

(30) Foreign Application Priority Data

Oct. 31, 2006    (KR) .................... 10-2006-0106351

(51) Int. Cl.
*H03L 7/00*    (2006.01)
(52) U.S. Cl. .................... 327/143; 327/142; 327/198
(58) Field of Classification Search ............ 327/142, 327/143, 198, 153, 161, 80, 81
See application file for complete search history.

(56) References Cited

U.S. PATENT DOCUMENTS

| | | | | |
|---|---|---|---|---|
| 5,374,923 A | * | 12/1994 | Sakamoto | 340/654 |
| 5,691,887 A | * | 11/1997 | Sher | 363/49 |
| 6,204,701 B1 | * | 3/2001 | Tsay et al. | 327/143 |
| 7,295,050 B2 | * | 11/2007 | Shin et al. | 327/143 |

* cited by examiner

*Primary Examiner*—Long Nguyen
(74) *Attorney, Agent, or Firm*—Townsend and Townsend and Crew LLP

(57) ABSTRACT

A power-on reset circuit includes a power detector to generate a detect voltage by detecting an internal voltage. An output unit outputs a power-up reset signal using the detect voltage. A delay unit is configured to delay the power-up reset signal and generate a delay voltage. A switch device is configured to be controlled using the delay voltage. A discharge unit discharges the detect voltage in response to the internal voltage and the power-up reset signal.

6 Claims, 2 Drawing Sheets

POWER-ON RESET CIRCUIT

CROSS-REFERENCES TO RELATED APPLICATIONS

The present application claims priority to Korean patent application number 10-2006-106351, filed on Oct. 31, 2006, which is incorporated by reference in its entirety.

BACKGROUND OF THE INVENTION

The present invention relates to a power-on reset circuit, and more particularly, to a power-on reset circuit capable of reducing standby current.

Generally, registers in a chip maintain floating state by a device or a micro controller unit (MCU) before applying power. When the power supply is applied to the chip in the floating state, the registers in the chip set to an undesired condition. Also, when the power supply drops under a predetermined voltage, a macro block in the chip becomes unstable.

The power-on reset circuit prevents the chip from becoming unstable by generating a reset signal for itself without a separate reset circuit outside of the device, where the chip can become unstable when the power is ramped up or downed at startup. The power-on reset circuit detects whether an internal voltage drops under a predetermined level and when the voltage drops under the predetermined level, the power-on reset signal is generated so as to initialize.

BRIEF SUMMARY OF THE INVENTION

The present invention uses a switch to connect a PMOS transistor between circuit paths from internal voltage to ground voltage. In the instant of applying the internal voltage to a chip, the switch device is turned on to detect a voltage level, and after generating a reset signal, the switch device is turned off so as to reduce a standby current and to generate the reset signal. In other words, the switch device is turned off to reduce the standby current by reaching leakage current level of the switch device and then the reset signal is generated in exact level.

The present invention is related to a power-on reset circuit which comprises a power detector of generating detect voltage by detecting internal voltage; an output unit of outputting a power up reset signal by the detect voltage; a delay unit of delaying the power up reset signal and of generating delay voltage; a switch device of operating by responding to the delay voltage; and a discharge unit of discharging the detect voltage by responding to the internal voltage and the power up reset signal.

The power detector comprises a PMOS transistor of connecting to the internal voltage and a first node and of operating by responding to ground voltage; and a resistor of connecting between the first ground voltage and a second node.

The output unit includes a plurality of inverters to which the detect voltage is applied of outputting the power up reset signal.

The delay unit includes a plurality of inverters of receiving the power up reset signal and of applying the delay voltage to a forth node; and a capacitor of charging voltage by connecting to any interval among the inverters.

The switch device connects to the second node and the ground voltage and operates by responding the delay voltage.

The discharge unit comprises a NOR gate of generating output voltage to a third node by responding the internal voltage and the power up reset signal; and an NMOS transistor of operating by responding to the output of the third node and by connecting the first node and the ground voltage.

Hereinafter, an embodiment of the present invention will be explained with reference to the accompanying drawings. However, the invention is not limited the disclosed embodiment, additional advantages, objects, and features of the invention will be set forth in part in the description which follows and in part will become apparent to those having ordinary skill in the art upon examination of the following or may be learned from practice of the invention.

DESCRIPTION OF SPECIFIC EMBODIMENTS

Figure 1:
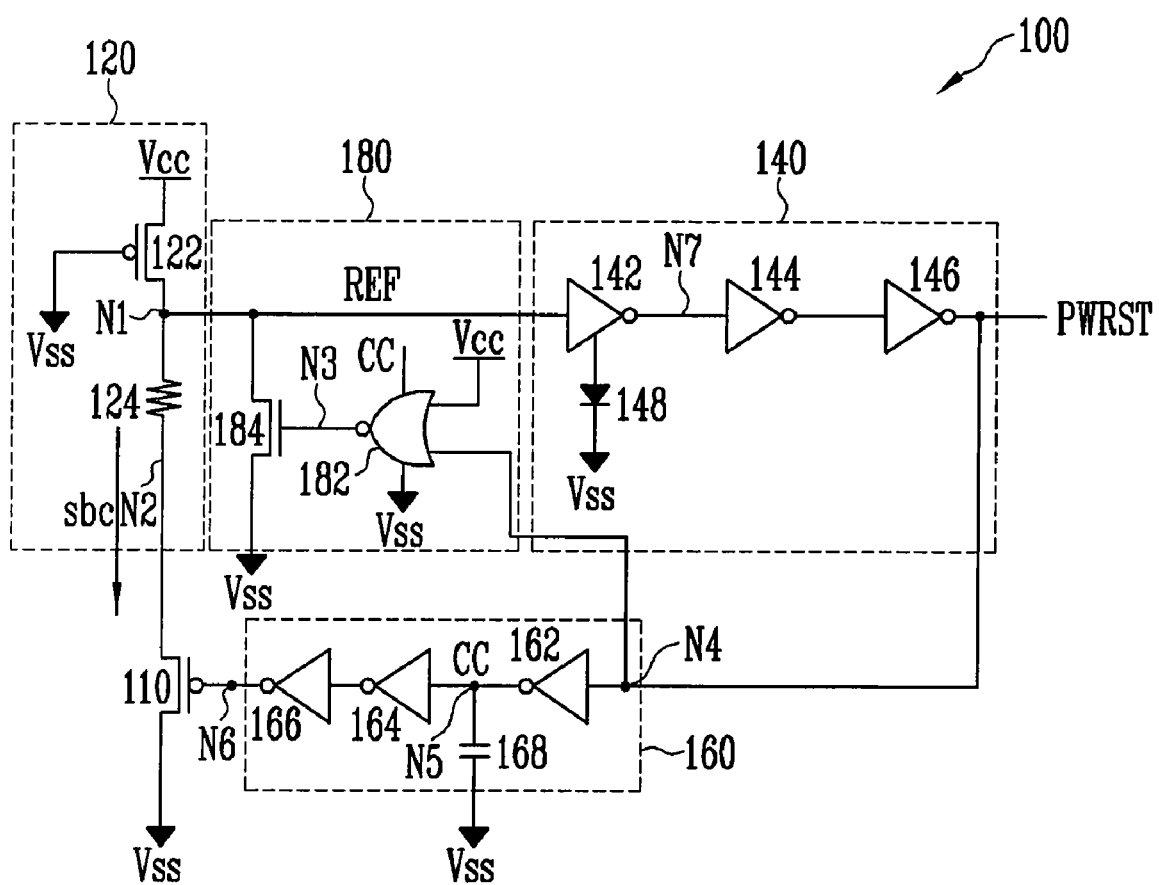
FIG. 1 is a circuit of a power-on reset circuit according to the present invention.

FIG. 1 is a detailed circuit of a power-on reset circuit according to the present invention. The power-on reset circuit 100 comprises a power detector 120, an output unit 140, a delay unit 160, a discharge unit 180, and a switch device 110.

The power detector 120 includes a PMOS transistor 122 and a resistor 124. The PMOS transistor 122 connects between an internal voltage Vcc and a node N1. A resistor 124 connects between nodes N1 and N2. A gate of the PMOS transistor 122 is turned on by connecting to ground voltage Vss. The PMOS transistor 122 is turned on so that a voltage level of the internal voltage Vcc is applied to the node N1.

The output unit 140 includes first to third inverters 142, 144, 146, and a diode 148. The inverters 142, 144, 146 are serially connected to nodes N1 and N4, and a power up reset signal PWRST of the node N4 is generated by using an output voltage of the third inverter 146.

Generally, the power-on reset circuit comprises of a power detector 120 and an output unit 140. The output voltage level of the output unit is increased after the internal voltage is supplied from the outside and output of the PMOS transistor is higher than a turn-on voltage. From the moment the level of detect voltage REF increases, voltage is applied to the first inverter 142 so that the voltage applied to a node N7 becomes a high level. In this time, the power up reset signal PWRST rises to equal the level of the internal voltage. When the detect voltage REF increases higher than an input voltage of the first inverter 142, the voltage applied to the node N7 is changed to a low level and the power up reset signal PWRST is changed to a low level. At this point, the voltage applied to the first inverter 142 is the sum of turn-on voltage of the diode 148 and turn-on voltage of an NMOS transistor of which the first inverter 142 comprises. The power up reset signal PWRST generated by the operation is used in an outside circuit, for example, a logic block, etc. Although the operation of the power-on reset circuit finishes, standby current sbc flows continuously through the PMOS transistor 122 and the resistor 124 of the power detector 120 from the internal voltage Vcc to the ground voltage. To prevent the standby current from flowing, the power-on reset circuit of the present invention further comprises of a delay unit 160, a switch device 110 and a discharge unit 180.

The delay unit 160 includes a plurality of resistors 162, 164, 166, and a capacitor 168. First to third inverters 162, 164, 166 are connected serially to node N4 and node N6. A node N5 which is connected to the first inverter 162 and the second inverter 164 is connected to the capacitor 168. The capacitor 168 connects between the node N5 and ground voltage Vss.

The switch device 110 is formed by the PMOS transistor. The switch device 110 connects to the node N2 and the ground voltage Vss in response to the voltage level applied to the node N6.

The discharge unit 180 includes a NOR gate 182 and the NMOS transistor 184. The internal voltage Vcc and the power up reset signal PWRST which is applied to the node N4 are applied to two input terminals of the NOR gate 182. The NMOS transistor 184 operates according to the output of the NOR gate 182 and connects to the node N1 and a ground voltage.

A description of the operation of the power-on reset circuit is as follows. A gate of the PMOS transistor 122 which is included in the power detector 120 connects to the ground voltage Vcc. When the PMOS transistor 122 is turned on, the internal voltage Vcc is applied to the PMOS transistor 122. When the internal voltage Vcc is higher than a threshold voltage level of the PMOS transistor 122, the high level voltage starts to be applied to the node N1.

Accordingly the detect voltage REF applied to the node N1 changes to the high level and the power up reset signal outputting through the inverters 142, 144, 146 changes to the low level. The forth inverter 162 receives the power up reset signal PWRST of the low level so as to apply the high level voltage to the node N5. The voltage of the high level is applied to the node N5 which causes a delay and then the voltage of the high level is applied to the node N6 through the fifth and the sixth inverters 164, 166.

The voltage charged in the capacitor 168 is used as a power supply for the NOR gate 182. The switch device 110 is turned off because the voltage applied to the node N6 is the high level. Thus, after the operation of the power-on reset circuit 100 finishes, the switch device 110 turns off so that the standby current sbc may be reduced.

The level of the internal voltage Vcc may switch between an on state and an off state. When the internal Vcc changes from the on state to the off state, it is possible that the detect voltage REF does not detect the off state of the power supply voltage as the internal voltage maintains the voltage level of the on state for awhile. Although the internal voltage Vcc becomes the off state, the detect voltage REF does not directly drop to zero volt and keeps the previous state, and then the level of the detect voltage is changed after a time delay.

When the internal voltage is turned off, the NOR gate 182 and the NMOS transistor 184 are used for minimizing the time delay. The NOR gate 182 includes two input terminals and uses the voltage charged to the capacitor 168 as a power supply voltage. The internal voltage Vcc and the power up reset signal PWRST are applied to the two input terminals.

Firstly, the internal voltage Vcc becomes the off state, and the detect voltage of the high level remains in the node N1, and the power up reset signal PWRST keeps the low level. However, the internal voltage Vcc, which becomes the off state, is applied to one of the input terminals of the NOR gate Vcc, and the power up reset signal PWRST of the lower level is applied to another of the input terminals.

In other words, when the low level is applied to two input terminals of the NOR gate 182, the output of the high level is applied to the node N3. In this case, voltage of the high level is applied to the NMOS transistor from the node N3 so that the NMOS transistor 184 is turned on. When the NMOS transistor 184 is turned on, an electric potential of the node N1 changes to the low level. Namely, the level of the detect voltage REF changes from high to low and recognizes the internal voltage Vcc which is the off state so as to accelerate the output reaction speed of the power up reset signal PWRST.

Figure 2:
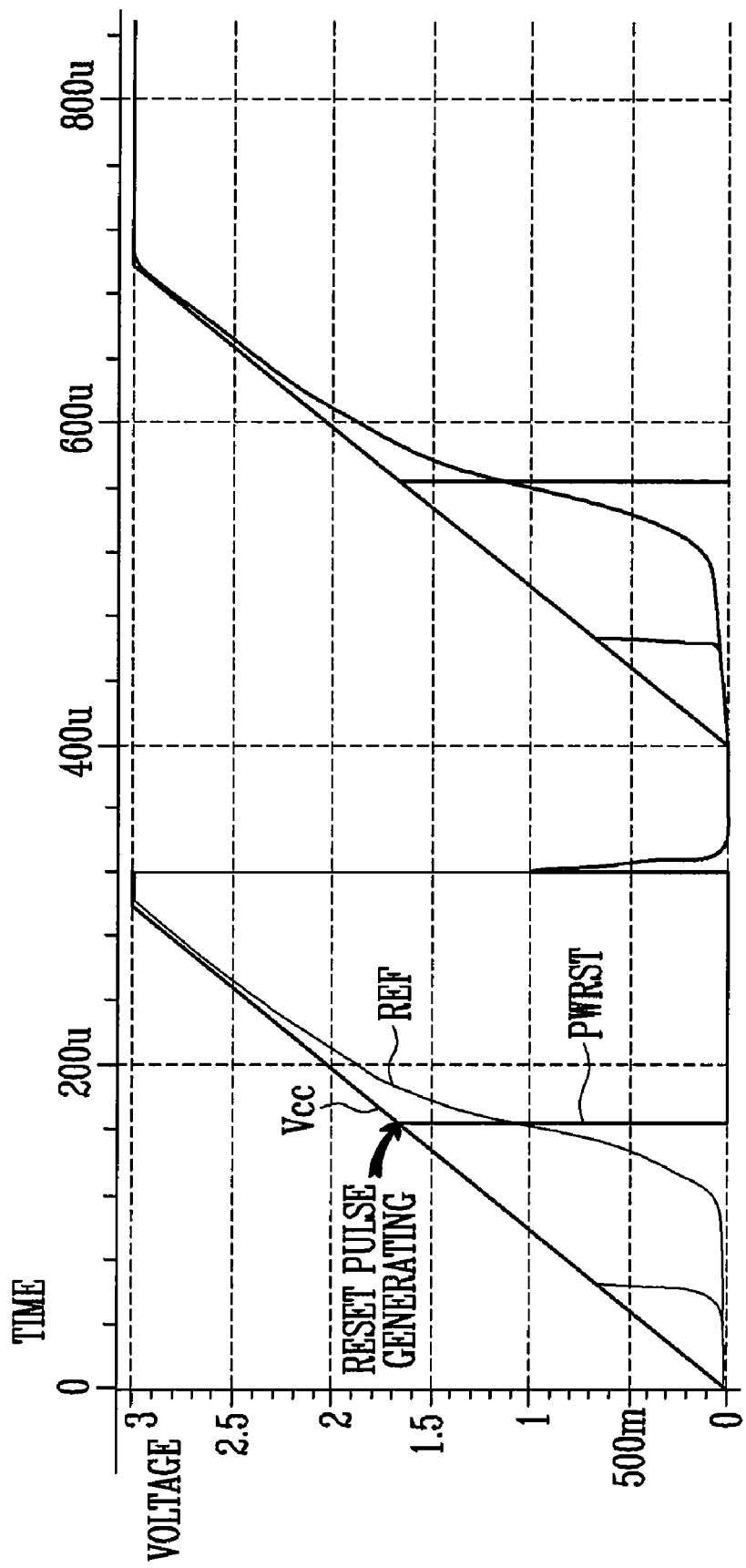
FIG. 2 is a simulation graph of the power-on reset circuit of FIG. 1.

FIG. 2 shows a simulation graph of the power-on reset circuit of FIG. 1. Voltage of the internal voltage Vcc, the detect voltage REF, and the power up reset signal PWRST vs. time are shown in the graph. In a time interval from zero to 280 u, the internal voltage Vcc is the on state, and in the interval from 280 to 400 u, the internal voltage Vcc is the off state, and in the interval after 400 u, the internal voltage Vcc is the on state. In the interval from zero to 280 u, the detect voltage REF is slowly increased according to the level increase of the internal voltage Vcc. When the detect voltage REF is the low level, the power up reset signal PWRST keeps the high level state. When the level of the reference voltage REF becomes high enough so as to convert to the high level, the power up reset signal PWRST goes to the low level to generate a reset pulse.

The power-on reset circuit according to the present invention is comprised of a driving unit responding to the variation of the internal voltage so as to improve the response speed of outputting the power up reset signal and to reduce an average power consumption.

It will be apparent to those skilled in the art that various modifications and variations can be made in the present invention. Thus, it is intended that the present invention covers the modifications and variations of this invention provided they are within the scope of the appended claims and their equivalents.

What is claimed is:

1. A power-on reset circuit, comprising:
    a power detector to generate a detect voltage;
    an output unit to output a power-up reset signal using the detect voltage received from an output terminal of the power detector;
    a delay unit to delay the power-up reset signal and generate a delay voltage;
    a switch device coupled between the power detector and a ground, wherein the switch device is turned off when the detect voltage exceeds a target level; and
    a discharge unit configured to discharge a voltage of the output terminal of the power detector to the ground in response to an internal voltage and the power-up reset signal.

2. The power-on reset circuit according to claim 1, wherein the power detector comprises:
    a PMOS transistor connected to the internal voltage and the output terminal of the power detector, wherein the PMOS transistor is operable in response to a ground voltage; and
    a resistor provided between the output terminal of the power detector and the switch device.

3. The power-on reset circuit according to claim 1, wherein the output unit includes a plurality of inverters to which the detect voltage is applied to output the power-up reset signal.

4. The power-on reset circuit according to claim 1, wherein the delay unit includes:
    a plurality of inverters configured to receive the power-up reset signal and apply the delay voltage to a fourth node; and
    a capacitor connected to an interval between two of the inverters.

5. The power-on reset circuit according to claim 1, wherein the discharge unit comprises:
    a NOR gate to generate an output voltage in response to the internal voltage and the power up reset signal; and
    an NMOS transistor connected between the output terminal of the power detector and the ground in response to the output voltage.

6. The power-on reset circuit according to claim 1, wherein the power-up reset signal changes from a high level to a low level when the detect voltage exceeds the target level.

* * * * *